United States Patent
Chen et al.

(10) Patent No.: US 8,704,257 B2
(45) Date of Patent: Apr. 22, 2014

(54) LIGHT-EMITTING ELEMENT AND THE MANUFACTURING METHOD THEREOF

(75) Inventors: Shih-i Chen, Hsinchu (TW);
Chia-Liang Hsu, Hsinchu (TW);
Chiu-Lin Yao, Hsinchu (TW);
Tzu-Chieh Hsu, Hsinchu (TW);
Chien-Fu Huang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/022,098

(22) Filed: Feb. 7, 2011

(65) Prior Publication Data
US 2011/0121291 A1 May 26, 2011

Related U.S. Application Data

(63) Continuation-in-part of application No. 12/751,642, filed on Mar. 31, 2010.

(30) Foreign Application Priority Data

Mar. 31, 2009 (TW) .............................. 98110800 A

(51) Int. Cl.
*H01L 33/00* (2010.01)
(52) U.S. Cl.
USPC 257/98; 257/99; 257/E33.056; 257/E33.065; 257/E33.068; 438/26; 438/29
(58) Field of Classification Search
USPC ............................. 257/98, E33.001, E33.055, 257/E33.067–E33.073, 99; 438/22, 26–29, 438/33, 36, 39, 42–46, 116, FOR. 104
See application file for complete search history.

(56) References Cited

U.S. PATENT DOCUMENTS

| | | | |
|---|---|---|---|
| 6,657,236 B1 * | 12/2003 | Thibeault et al. | 257/98 |
| 6,838,704 B2 * | 1/2005 | Lin et al. | 257/98 |
| 7,335,924 B2 * | 2/2008 | Liu et al. | 257/98 |
| 7,723,738 B2 | 5/2010 | Nakashima et al. | |
| 2008/0224160 A1 * | 9/2008 | Chang et al. | 257/98 |
| 2008/0308832 A1 * | 12/2008 | Hsieh et al. | 257/98 |
| 2009/0134416 A1 * | 5/2009 | Lee | 257/98 |
| 2009/0224272 A1 * | 9/2009 | Yu et al. | 257/98 |
| 2010/0012962 A1 * | 1/2010 | Hong et al. | 257/98 |
| 2010/0038664 A1 * | 2/2010 | Strauss | 257/98 |
| 2010/0308365 A1 * | 12/2010 | Masuya et al. | 257/98 |
| 2011/0316023 A1 * | 12/2011 | Yeh | 257/98 |

FOREIGN PATENT DOCUMENTS

| | | | | |
|---|---|---|---|---|
| JP | 06-045648 A | | 2/1994 | |
| JP | 2009-212500 | * | 9/2009 | ............ H01L 33/00 |
| JP | 2009-295611 | * | 12/2009 | ............ H01L 33/00 |
| TW | 201114066 A | | 4/2011 | |
| WO | WO 2008/040289 | * | 4/2008 | ............ H01L 33/00 |
| WO | WO 2008040289 | * | 4/2008 | ............ H01L 33/00 |

* cited by examiner

*Primary Examiner* — Fernando L Toledo
*Assistant Examiner* — Victoria K Hall
(74) *Attorney, Agent, or Firm* — Patterson & Sheridan, LLP

(57) ABSTRACT

A light-emitting element includes a light-emitting stack for emitting light and a substrate structure including: a first substrate disposed under the light-emitting stack and having a first surface facing the light-emitting stack; and a second substrate disposed under the light-emitting stack and having a second surface facing the light-emitting stack; and a reflective layer formed between the first substrate and the second substrate and having an inclined angle not perpendicular to the first surface.

15 Claims, 11 Drawing Sheets

LIGHT-EMITTING ELEMENT AND THE MANUFACTURING METHOD THEREOF

REFERENCE TO RELATED APPLICATION

This application is a continuation-in-part of U.S. patent application Ser. No. 12/751,642, entitled "A PHOTOELECTRONIC ELEMENT AND THE MANUFACTURING METHOD THEREOF", filed on Mar. 31, 2010, which claims the right of priority based on TW application Serial No. 098110800 filed on Mar. 31, 2009, the entire contents of which are incorporated herein by reference.

TECHNICAL FIELD

The application relates to a light emitting element, and more particularly to a light emitting element including a reflective layer.

DESCRIPTION OF BACKGROUND ART

The lighting theory and structure of light-emitting diode (LED) is different from that of conventional lighting source. LED has advantages as a low power loss, a long life-time, no need for warm-up time, and a short responsive time. Moreover, it is small, shockproof, suitable for mass production, and highly compatible with applications demanding a tiny or array-type element, so LEDs are widely adopted in the market. For example, LEDs can be used in optical display apparatus, laser diodes, traffic lights, data storage devices, communication devices, illumination devices, medical devices, and so on.

Nevertheless, because the refractive index of an LED is greater than that of air, most of the emitted light thereof is reflected back inside from the interface between semiconductor layer and air. The efficiency of output of power (actual output of power/nominal power of the light source) of different materials is within a range of 2.21% to 4.18% without any additional processing.

Recently, a roughening process on the surface of the semiconductor layer or the substrate of an LED has been adopted, so the probability of the light output of the light which would be scattered because of the total reflection in conventional structure is increased. For other LEDs, the original substrate for epitaxial-growth is removed and the semiconductor layer is bonded with another substrate having a large size so that the substrate having a reflective layer at the bottom increases the probability of the light output by providing another chance for the light to be reflected.

SUMMARY OF THE DISCLOSURE

The present application discloses a light-emitting element including: a light-emitting stack for emitting light; and a substrate structure comprising: at least a first substrate disposed under the light-emitting stack and having a first surface facing the light-emitting stack; and a second substrate disposed under the light-emitting stack and being a transparent substrate, wherein the second substrate has a second surface facing the light-emitting stack; and a reflective layer formed between the first substrate and the second substrate and having an inclined angle not perpendicular to the first surface to reflect the light emitted from the light-emitting stack.

The present application discloses a manufacturing method of a light-emitting element including steps of providing a first substrate and forming a recess structure thereon, wherein the recess structure defines a plurality of protrusions having side walls not perpendicular to the bottom surface of the first substrate; forming a reflective layer conformably on the surface of the first substrate; forming a substrate structure by forming a transparent second substrate in the recess structure of the first substrate, so that a substrate structure includes the first substrate and the second substrate; and providing a light-emitting stack attached to the substrate structure.

The present application discloses a manufacturing method of a light-emitting element including steps of providing a first substrate and forming a recess structure thereon, wherein the recess structure defines a plurality of protrusions having side walls not perpendicular to the bottom surface of the first substrate; forming a reflective layer conformably on the surface of the first substrate; providing a light-emitting stack attached to the first substrate; and forming a substrate structure including the first substrate and a second substrate by filling a transparent material into the recess structure of the first substrate, and solidifying the transparent material to form the second substrate, therefore a substrate structure including the first substrate and the second substrate is formed.

DETAILED DESCRIPTION OF PREFERRED EMBODIMENTS

Figure 1:
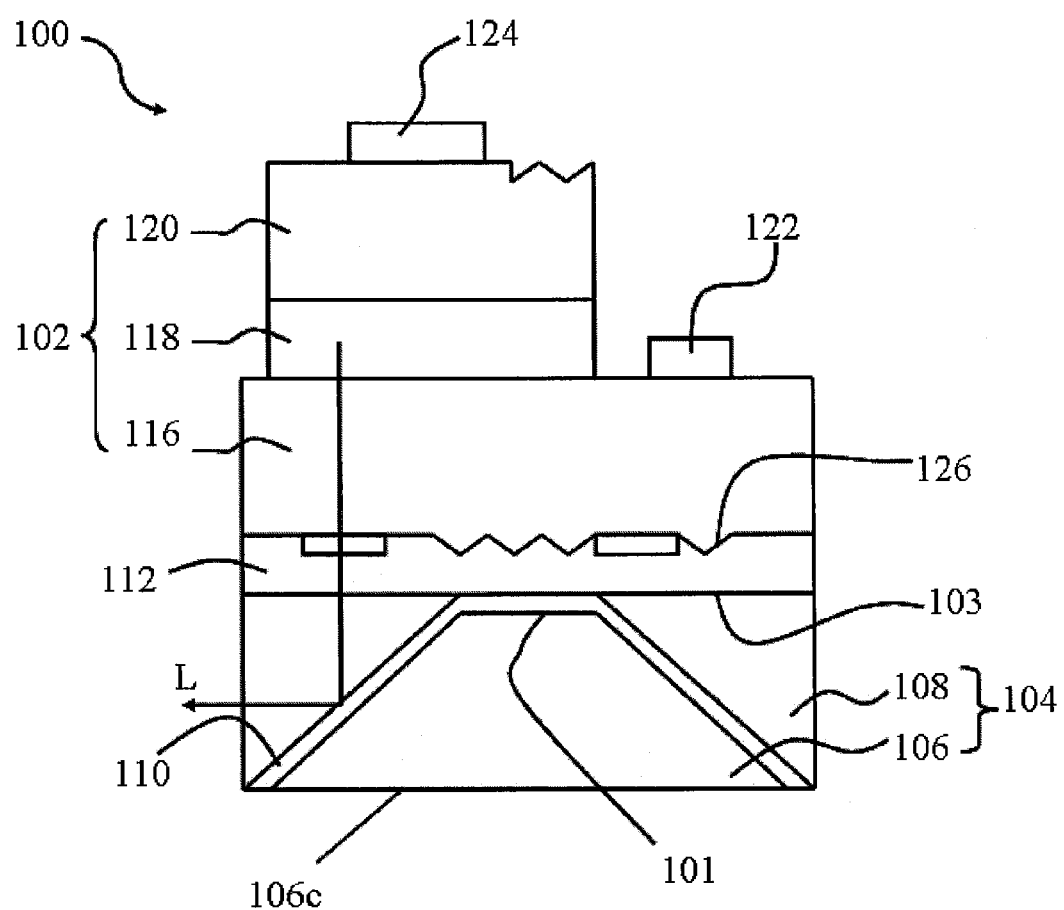
FIG. 1 is a schematic diagram of a light-emitting element of a first embodiment of the present application.

As shown in FIG. 1, a light-emitting element 100 of a first embodiment of the present application includes a light-emitting stack 102 for emitting light L; a substrate structure 104 formed under the light-emitting stack 102 including: a first substrate 106 formed under the light-emitting stack 102 and having at least a first surface 101 facing the light-emitting stack 102 and parallel to a bottom surface 106c of the first substrate 106; and a second substrate 108 formed under the light-emitting stack 102 and being a transparent substrate, and the second substrate 108 having at least a second surface 103 facing the light-emitting stack 102 and parallel to the bottom surface 106c of the first substrate 106; and at least a reflective layer 110 formed between the first substrate 106 and the second substrate 108 and having an inclined angle not perpendicular to the first surface 101 to reflect the light L emitted from the light-emitting stack 102. The first substrate 106 can be a conductive substrate or an insulative substrate, and the light L emitted from the light-emitting stack 102 can reach the reflective layer 110 because of the transparency of the second substrate 108. The second substrate 108 can be a single substrate surrounding the first substrate 106, and the cross section of the first substrate 106 can be a cone or pyramid shape that has a length of the bottom surface wider than that of the first surface 101, so that the light L can be reflected by the reflective layer 110. and emitted from the side surface of the second substrate 108. The first substrate 106 can be either a wedge-shaped substrate having two inclined surfaces on two sides thereof, and the second substrate 108 can be formed on the two inclined surfaces of the first substrate 106.

Additionally, an insulating-adhesive layer 112 can be further formed between the substrate structure 104 and the light-emitting stack 102 to attach the light-emitting stack 102 to the substrate structure 104. A plurality of ohmic contact layers can be distributed on the bottom of the light-emitting stack and covered by the insulating-adhesive layer 112, wherein the material of the ohmic contact layer can be GeAu alloy. The aforesaid reflective layer 110 can be further formed between the first surface 101 and the insulating-adhesive layer 112. In addition, a part of the interface between the insulating-adhesive layer 112 and the light-emitting 102 can be roughed to form an uneven interface 126. The material of the insulating-adhesive layer 112 can be silicone resin, BCB, epoxy, polyimide, or PFCB. A diamond-like heat-dissipation layer (not shown) can be formed between the insulating-adhesive layer 112 and the light-emitting stack 102, or between the insulating-adhesive layer 112 and the reflective layer 110 to dissipate the heat of the light-emitting stack 102 to the substrate structure 104.

The first substrate 106 can be sapphire substrate, Si substrate, SiC substrate, GaN substrate, ZnO substrate, GaP substrate or ceramic substrate. The included angle formed by the inclined surface of the first substrate 106 with respect to the bottom surface 106c can be greater than 25 degree and less than 75 degree. Taking the Si substrate for example, an inclined surface having an included angle of 57.4 degree with respect to the bottom surface 106c of the first substrate 106 can be formed by wet etching the surface of the first substrate 106 along with the lattice of Si, and then the reflective layer 110 can be formed by sputtering or evaporation. The material of the second substrate 108 can be polyimide, BCB, PFCB, epoxy, acrylic resin, COC, PMMA, PET, PC, polyetherimide, fluorocarbon polymer, silicone resin, glass, $Al_2O_3$, $SiO_2$, $TiO_2$, $SiN_X$, or SOG.

The material of the reflective layer 110 can be one or more than one material selected from a group consisting of Cu, Al, In, Sn, Au, Pt, Zn, Ag, Ti, Pb, Pd, Ge, N, Cr, Cd, Co, Mn, Sb, Bi, Ga, Tl, Se, Te, Po, Ir, Re, Rh, Os, W, Li, Na, K, Be, Mg, Ca, Sr, Ba, Zr, Mo, La, Cu—Sn, Cu—Zn, Cu—Cd, Sn—Pb—Sb, Sn—Pb—Z, Ni—Sn, Ni—Co, and Au alloy.

The material of light-emitting 102 can include a first semiconductor layer 116, a light-emitting layer 118 formed on the first semiconductor layer 116, and a second semiconductor layer 120 formed on the light-emitting layer 118. The first semiconductor layer 116 is partially exposed for having a first electrode 122 thereon, and the second semiconductor layer has a second electrode 124 thereon. The material of the light-emitting stack 102 can be at least one element selected from a group consisting of Al, Ga, In, N, P and As, such as chemical compounds including AlGaInP, AlN, GaN, AlGaN, InGaN or AlInGaN. The structure of the light-emitting stack 102 can be single heterostructure (SH), double heterostructure (DH), double-side double heterostructure (DDH), or multi-quantum well structure (MQW).

Figure 2A:
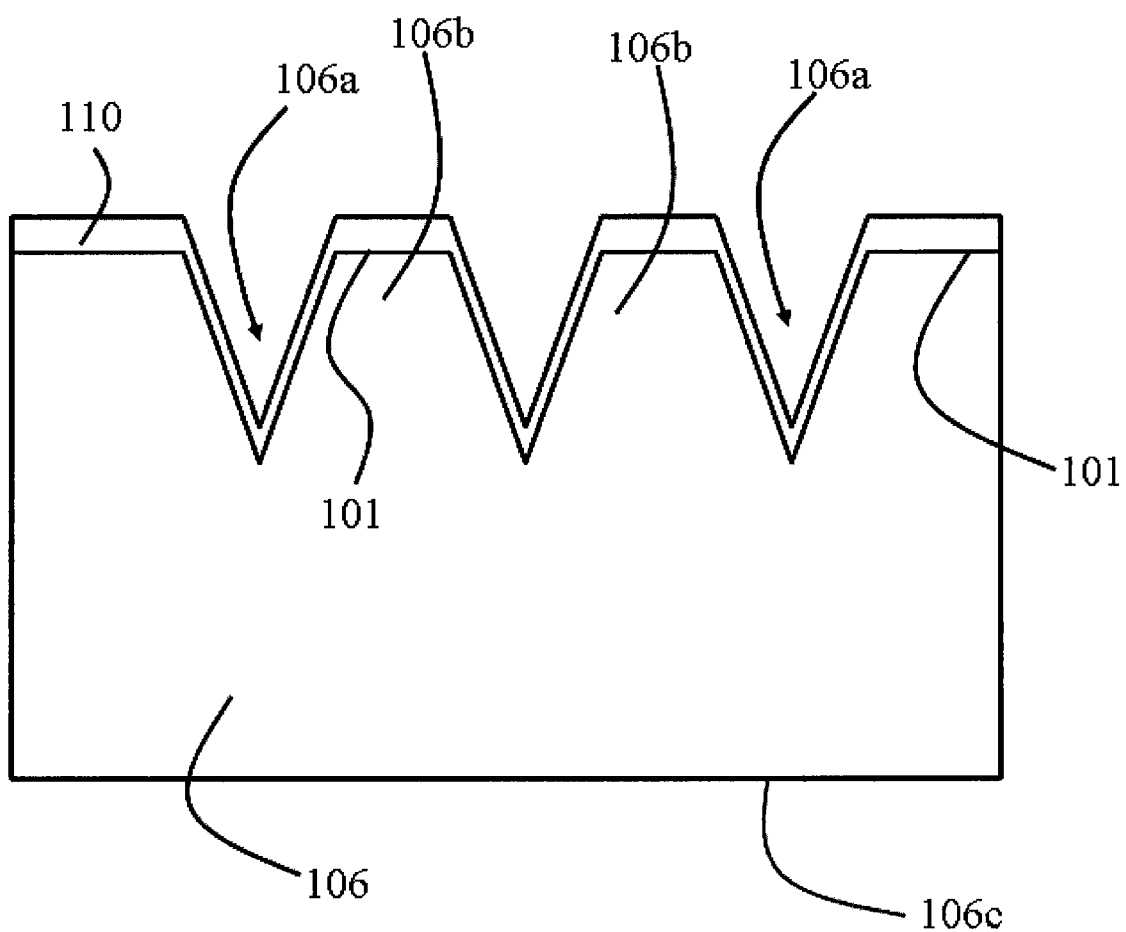
FIG. 2A to FIG. 2F show the manufacturing method of first embodiment of the present application.
Figure 2B:
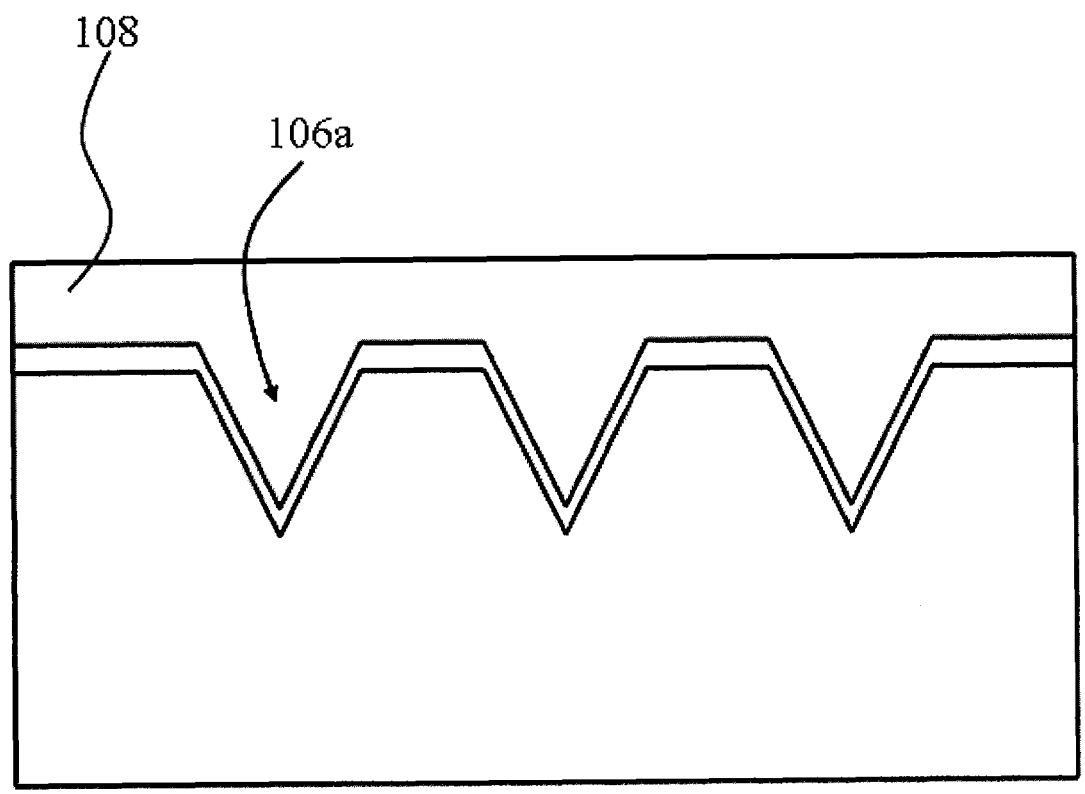
Figure 2C:
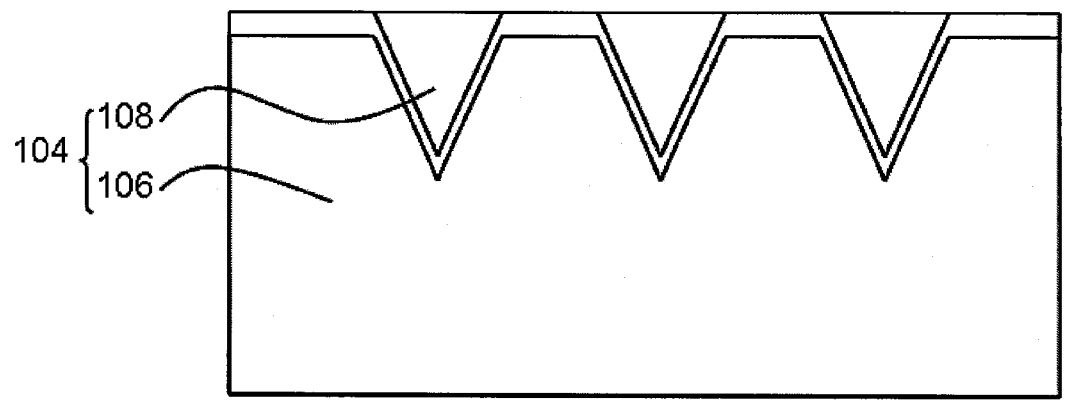
Figure 2D:
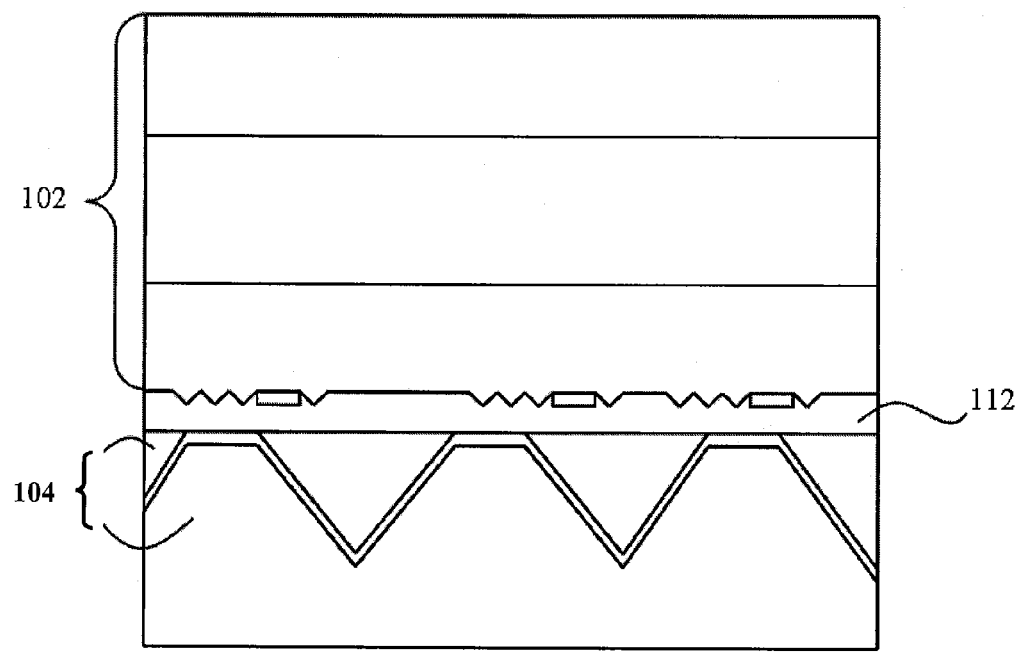
Figure 2E:
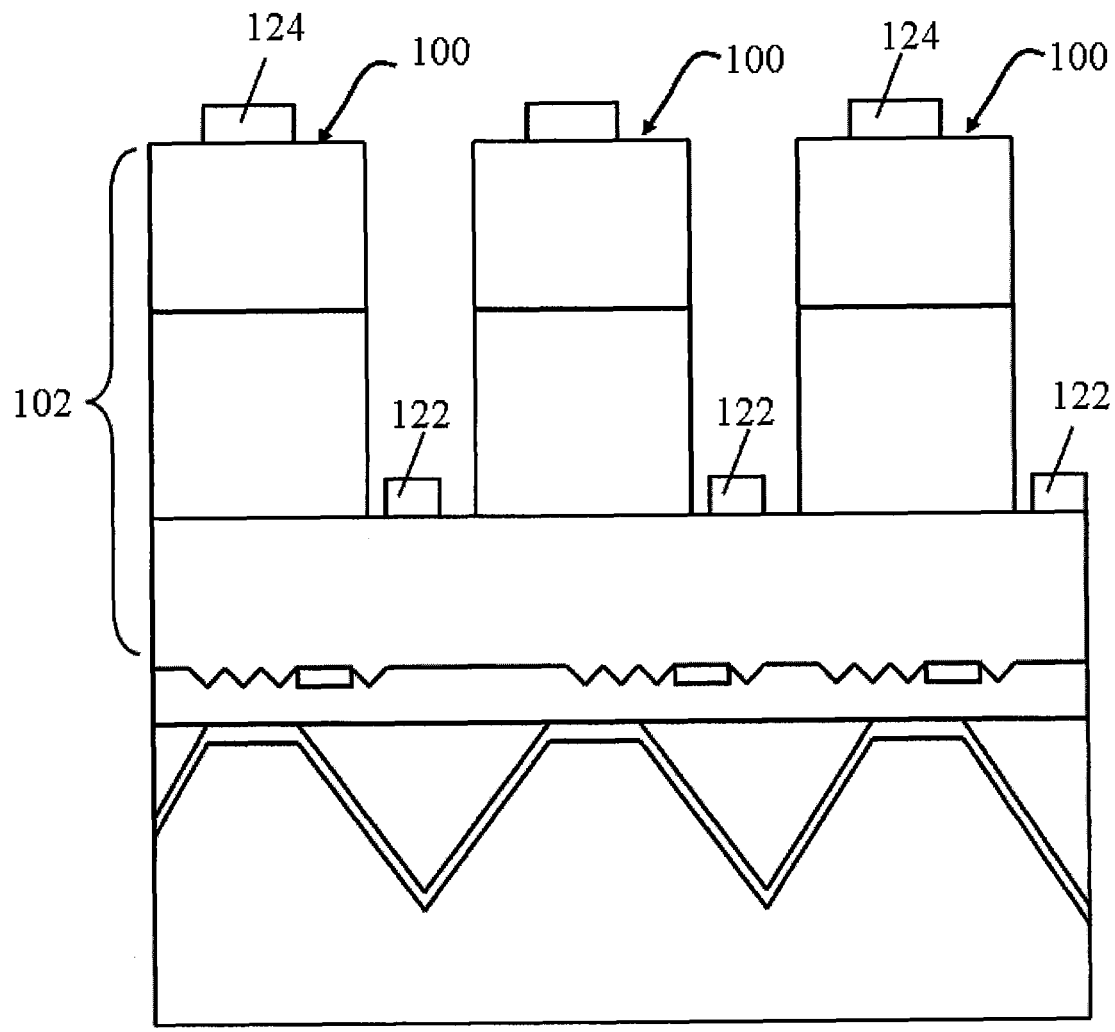
Figure 2F:
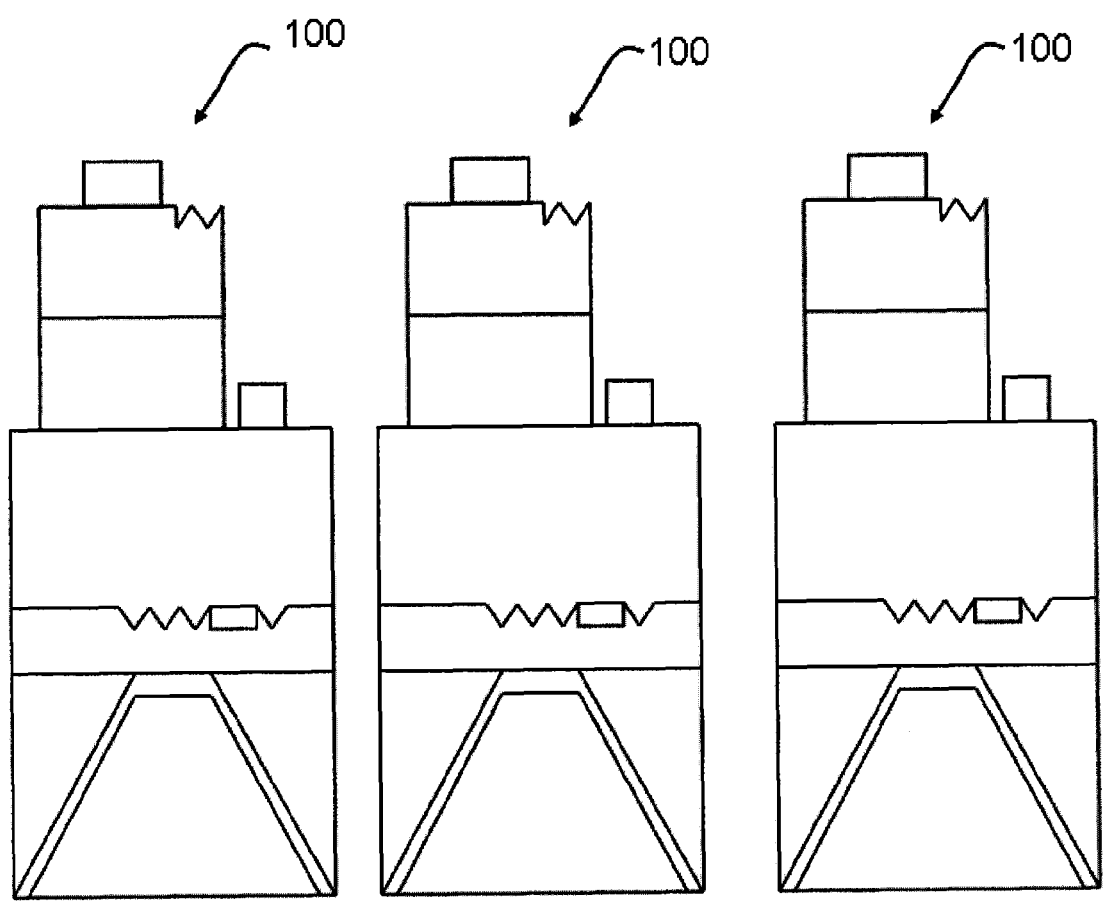

As shown in FIG. 2A to FIG. 2F, a manufacturing method of the light-emitting element of the first embodiment of the present application is disclosed. As shown in FIG. 2A, providing a first substrate 106 firstly, and a recess structure 106a defining a plurality of protrusions 106b having side walls not perpendicular to the bottom surface 106c of the first substrate 106 is formed thereon, and a reflective layer 110 can be conformably formed on the surface of the first substrate 106. As shown in FIG. 2B, a second substrate 108 is formed by filling a transparent liquid material in the recess structure 106a and then solidifying the transparent liquid material As shown in FIG. 2C, a polishing process is performed to remove the excess material of the second substrate 108, therefore forming a substrate structure 104 including the first substrate 106 and the second substrate 108. As shown in FIG. 2D, providing a light-emitting stack 102 is provided and forming an insulating adhesive layer 112 can be formed between the substrate structure 104 and the light-emitting stack 102. The insulating adhesive layer 112 is for attaching the light-emitting stack 102 to the substrate structure 104. The light-emitting stack 102 can be carried on a temporary substrate (not shown) in advance, and the temporary substrate can be removed after the substrate structure attaches to the light-emitting stack 102. As shown in FIG. 2E, a plurality of light-emitting elements 100 not separated from each other is defined on the light-emitting stack 102 by etching and lithography processes, and a first electrode 122 and a second electrode 124 are formed on each light-emitting element 100. As shown in FIG. 2F, a dicing process is performed to separate the light-emitting elements 100 from each other.

Figure 3:
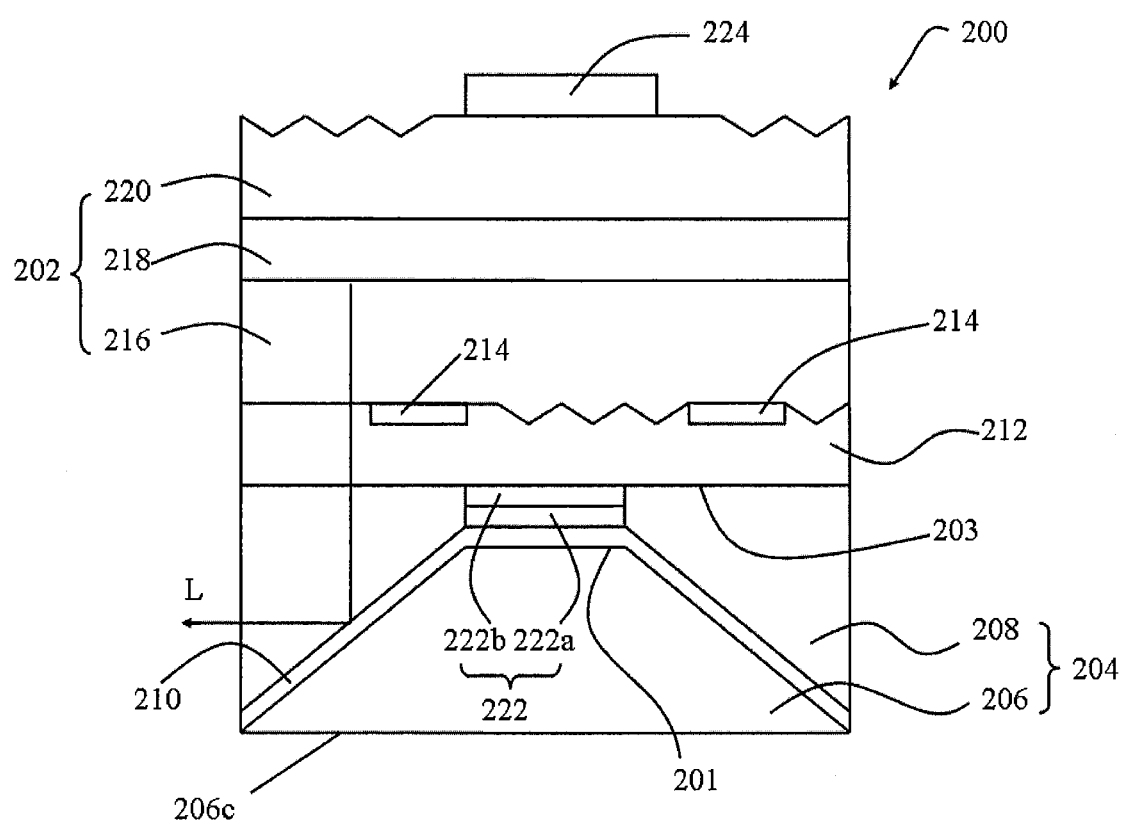
FIG. 3 is a schematic diagram of a light-emitting element of a second embodiment of the present application.

As shown in FIG. 3, a light-emitting element 200 of a second embodiment of the present application includes a light-emitting stack 202 for emitting light L; a substrate structure 204 formed under the light-emitting stack 202 including: a first substrate 206 formed under the light-emitting stack 202 and having at least a first surface 201 facing the light-emitting stack 202 and parallel to a bottom surface 206c of the first substrate 206; and a second substrate 208 formed under the light-emitting stack 202 and being a transparent substrate, and the second substrate 208 having at least a second surface 203 facing the light-emitting stack 202 and parallel to the bottom surface 206c of the first substrate 206; and at least a reflective layer 210 formed between the first substrate 206 and the second substrate 208 and having an inclined angle not perpendicular to the first surface 201 to reflect the light L emitted from the light-emitting stack 202. The first substrate 206 can be a conductive substrate, and the light L emitted from the light-emitting stack 202 can reach the reflective layer 210 because of the transparency of the second substrate 208. The second substrate 208 can be a single substrate surrounding the first substrate 206, and the cross section of the first substrate 206 can be the cross section of a cone or pyramid that has a length of the bottom surface wider than that of the upper surface, so that the light L can be reflected by the reflective layer 210 and emitted from the side surface of the second substrate 208. The first substrate 206 can be either a wedge-shaped substrate having two inclined surface on two sides, and the second substrate 208 can be formed on the two inclined surface of the first substrate 206.

The first substrate 206 of the present embodiment is a conductive substrate such as Si substrate, GaN substrate, ZnO substrate or GaP substrate. A first metal-attaching layer 222a can be formed on the first surface 201 of the first substrate 206, and a second metal-attaching layer 222b can be formed on a side of the first metal-attaching layer 222a close to the light-emitting stack 202, wherein the second metal-attaching layer 222b can have higher reflective index than that of the first metal-attaching layer 222a to reflect the light emitted from the light-emitting stack 202. A metal-alloy layer 222 is formed by the two metal-attaching layers to attach the light-emitting stack 202 to the substrate structure 204.

The metal-alloy layer 222 can be a single layer or multiple layers of metal alloy including In, Sn, Al, Au, Pt, Zn, Ag, Ti, Pb, Pd, Ge, Cu, Ni, AuSn, InAg, InAu, AuBe, AuGe, AuZn, PbSn or PdIn, wherein the part closest to the light-emitting stack 202 of the metal-alloy layer 222 has higher reflective index by mixing a high reflective metal such as Ag, Al, or Pt in the second metal attaching layer 222b. A transparent conductive layer 212 can be further formed between the light-emitting stack 202 and the substrate structure 204, and the metal-alloy layer 222 can be formed under the transparent conductive layer 212. A plurality of ohmic contact layers 214 can be separately formed on the bottom of the light-emitting layer 202, wherein the ohmic contact layers 214 can be GeAu alloy and are covered by the transparent conductive layer 212. The material of the transparent conductive layer 212 can be ITO, InO, SnO, CTO, ATO, AZO, ZTO or ZnO. A diamond-like heat-dissipation layer can be formed between the transparent conductive layer 212 and the light-emitting layer 202 to guide the heat from the light-emitting stack 202.

The light-emitting stack 202 can include a first semiconductor layer 216, a light-emitting layer 218 formed on the first semiconductor layer 216, and a second semiconductor layer 220 formed on the light-emitting layer 218, wherein an electrode 224 is formed on the semiconductor layer 220.

Figure 4A:
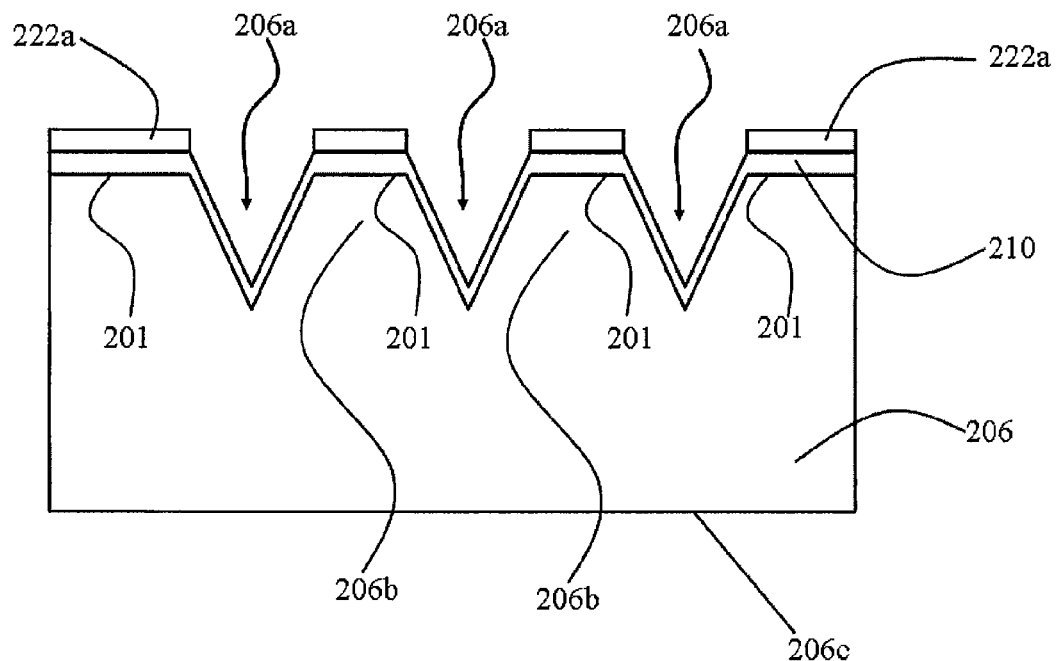
FIG. 4A to FIG. 4D show the manufacturing method of second embodiment of the present application.
Figure 4B:
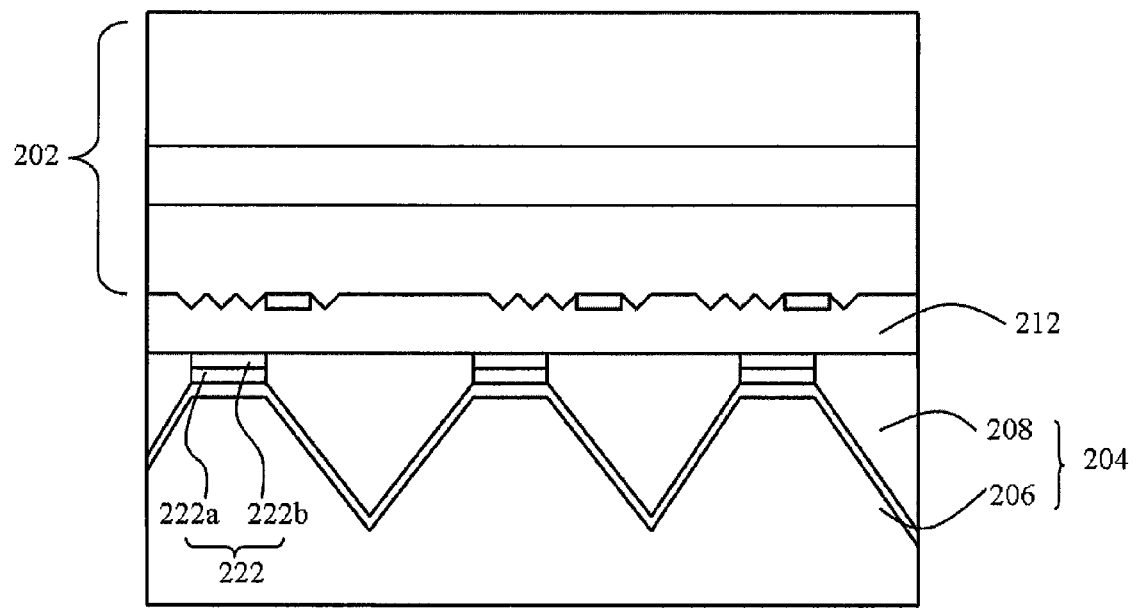
Figure 4C:
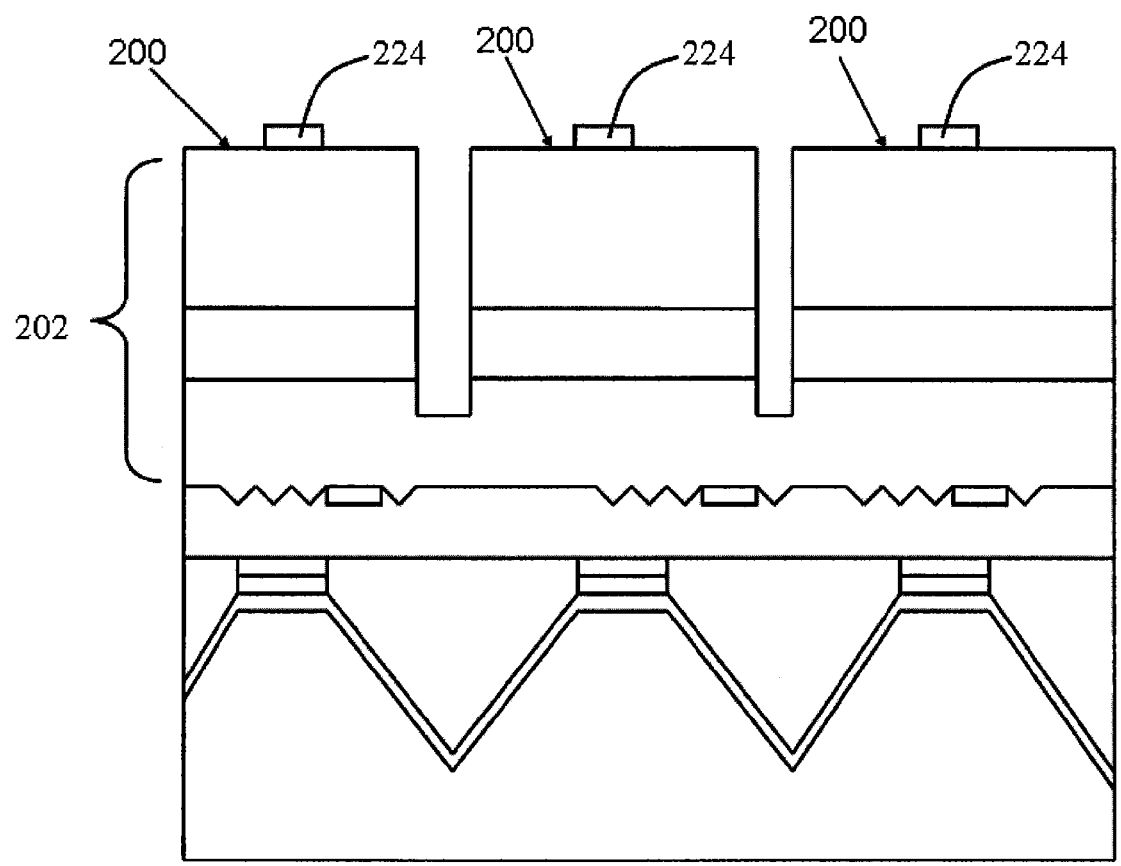
Figure 4D:
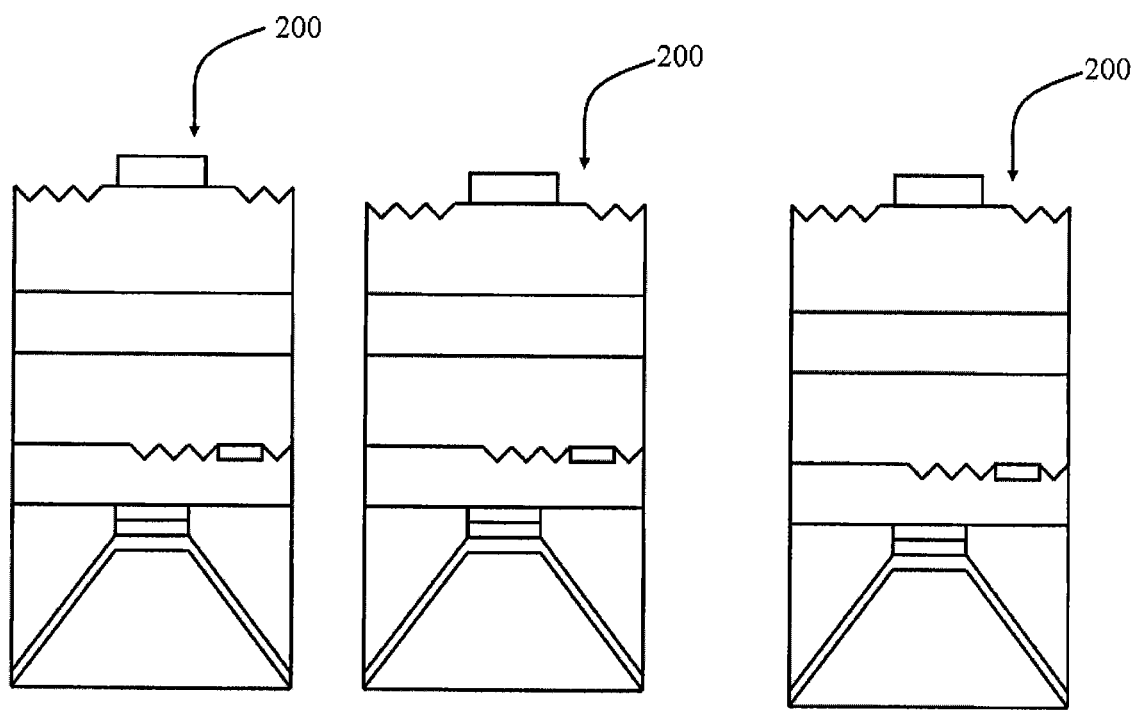

As shown in FIG. 4A to FIG. 4D, a manufacturing method of the light-emitting element of the second embodiment of the present application is disclosed. As shown in FIG. 4A, a first substrate 206 is provided firstly, and a recess structure 206a is formed on a first surface 201 of the first substrate 206 defining a plurality of protrusions 206b having side walls not perpendicular to the bottom surface 206c of the first substrate 206, and a reflective layer 210 can be conformably formed on the first surface 201 of the first substrate 206. After forming the reflective layer 210, a first metal-attaching layer 222a can be formed on the positions respectively corresponding to the plurality of protrusions of the first substrate 206. As shown in FIG. 4B, a plurality of second metal-attaching layers 222b is formed between a first metal- attaching layer 222a and a light-emitting stack 202. An attaching process, such as heating or ultrasonic wave process, is performed to combine the first metal-attaching layer 222a and the second metal-attaching layer 222b to form a metal alloy layer 222 therefore attaching the light-emitting layer 202 to the first substrate 206. A transparent conductive layer 212 can be formed on the bottom of the light-emitting stack 202 in advance, and the second metal-attaching layer 222b can be completely formed on the transparent conductive layer 212, and then partial regions of the second metal-attaching layer 222b may be selectively removed. Then a transparent liquid material is filled in the recess structure 206a of the first substrate 206 to form the second substrate 208 by solidifying the transparent liquid material, and therefore a substrate structure 204 including the first substrate 206 and the second substrate 208 is formed. The first metal-attaching layer 222a and the second metal-attaching layer 222b can be In, Sn, Au, Pt, Zn, Ti, Pb, Pd, Ge, Cu, Ni, AuSn, InAg, InAu, AuBe, AuGe, AuZn, PbSn or PdIn. The material and the forming method of the second substrate 208 are similar to that of the first embodiment, while the second substrate 208 can be filled in the spaces between the first substrate 206 and the light-emitting stack 202. In the present embodiment, the substrate 204 is formed by attaching the first substrate 206 and the light-emitting stack 202, and then filling the second substrate 208 therebetween, while the second substrate 208 can be formed in the recess structure 206a before attaching the light-emitting stack 202 on the substrate structure 204. If the material of the second substrate 208 is silicone resin, BCB, epoxy, polyimide or PFCB, the attaching process between the first metal-attaching layer 222a and the second metal-attaching layer 222b can cause the second substrate 208 adhesive to be attached to the bottom of the light-emitting stack 202. As shown in FIG. 4C, etching and lithography processes are performed to define a plurality of light-emitting element 200 not completely separated from each other and an electrode 224 on each light-emitting element 200 is formed. As shown in FIG. 4D, a dicing process is performed to separate the light-emitting elements from each other.

Figure 5:
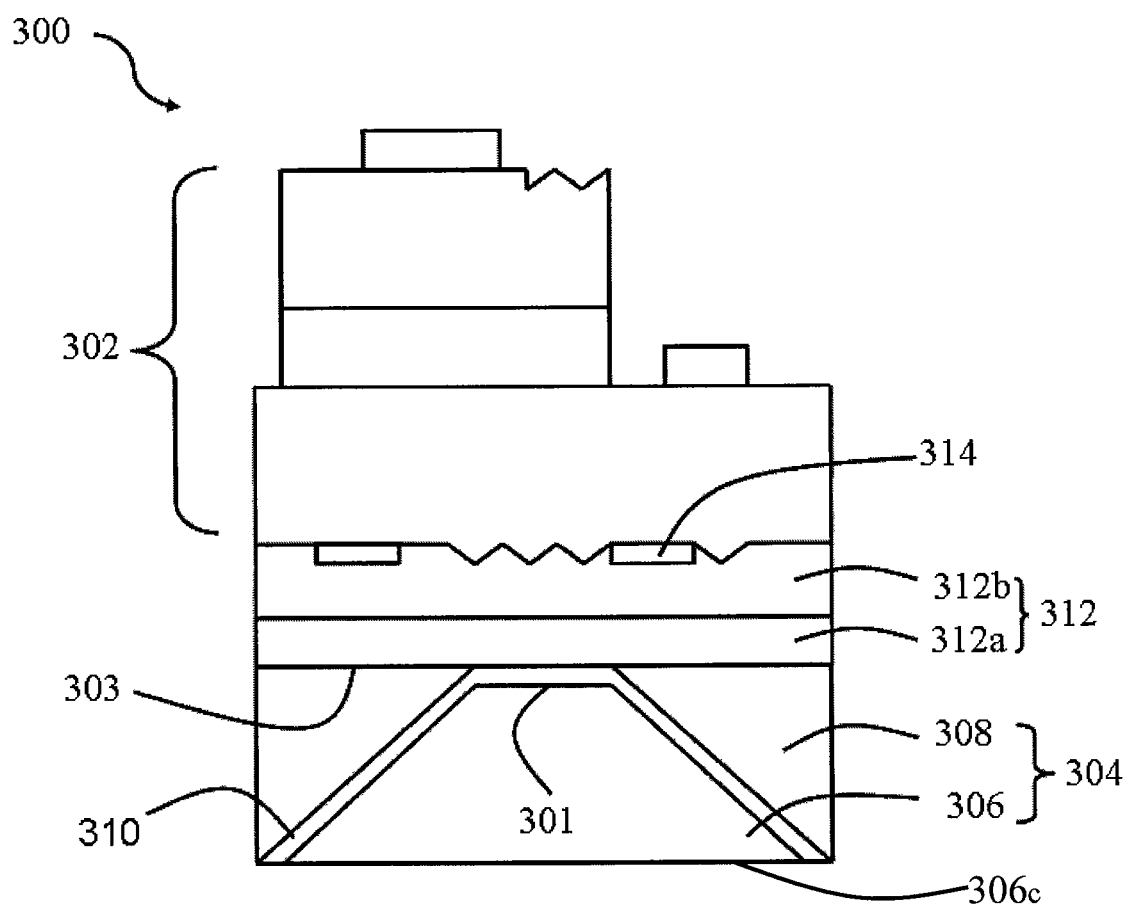
FIG. 5 is a schematic diagram of a light-emitting element of a third embodiment of the present application.

As shown in FIG. 5, a light-emitting element 300 of a third embodiment of the present application includes a light-emitting stack 302 for emitting light; a substrate structure 304 formed under the light-emitting stack 302 including: a first substrate 306 formed under the light-emitting stack 302 including and having at least a first surface 301 facing the light-emitting stack 302 and parallel to a bottom surface 306c of the first substrate 306; and a second substrate 308 formed under the light-emitting stack 302 and being a transparent substrate, and the second substrate 308 having at least a second surface 303 facing the light-emitting stack 302 and parallel to the bottom surface 306c of the first substrate; and at least a reflective layer 310 formed between the first substrate 306 and the second substrate 308 and having an inclined angle not perpendicular to the first surface 301 to reflect the light L emitted from the light-emitting stack 302. The difference between the present embodiment and the aforesaid embodiments is that the light-emitting stack 302 attaches to the substrate structure 304 via a transparent conductive bonding structure 312 including: a first transparent-conductive bonding layer 312a formed on the substrate structure 304; and a second transparent-conductive bonding layer 312b formed on the bottom of the light-emitting stack 302. By attaching the first transparent-conductive bonding layer 312a to the second transparent-conductive bonding layer 312b, the light-emitting stack 302 can be attached to the substrate structure 304. In addition, a plurality of ohmic contact layers 314 are formed on the bottom of the light-emitting stack 302 and covered by the second transparent-conductive bonding layer 312b, wherein the material of the ohmic contact layer 314 can be GeAu alloy. The forming position of the electrode of the present embodiment can be the same with the first embodiment or the second embodiment. In the embodiment wherein the structure of the light-emitting stack 302 is similar to the first embodiment discussed above having two electrodes formed on the same side and having polarities that are different to each other, the first substrate 306 and the second substrate 308 can be insulating substrates or conductive substrates having an insulating layer thereon to insulate to the light-emitting stack 302. In the embodiment wherein the electrode in the light-emitting stack 302 is configured to form in a position similar to the position of the electrode formed in the second embodiment discussed above, at least the first substrate 306 is a conductive substrate. The materials of the first transparent-conductive bonding layer 312a and the second transparent-conductive bonding layer 312 can be ITO, InO, SnO, CTO, ATO, AZO, ZTO or ZnO.

What is claimed is:

1. A light-emitting element comprising:
   a light-emitting stack for emitting light;
   a transparent conductive layer disposed below the light-emitting stack;
   an ohmic contact layer disposed between the light-emitting stack and the transparent conductive layer;
   a substrate structure disposed under the light-emitting stack comprising:
     a first substrate disposed under the light-emitting stack and having a first surface facing the light-emitting stack; and a second substrate being a transparent substrate, disposed under the light-emitting stack, and having at least a second surface facing the light-emitting stack; and a reflective layer formed between the first substrate and the second substrate and having an inclined angle not perpendicular to the first surface to reflect the light from the light-emitting stack, wherein the second surface of the second substrate is discontinuous in cross-section; and a bonding structure formed between the substrate structure and the transparent conductive layer, wherein the bonding structure comprises a first conductive-attaching layer formed on the substrate structure and a second conductive-attaching layer formed on the bottom of the transparent conductive layer and wherein the bonding structure is offset laterally from the ohmic contact layer.

2. The light-emitting element according to claim 1, wherein the second substrate surrounds the first substrate, and the cross section of the first substrate is a truncated triangle shape that has a length of a bottom surface wider than that of the first surface.

3. The light-emitting element according to claim 1, wherein the first substrate is a wedge-shaped substrate having two inclined surfaces on two sides thereof, and the second substrate is formed on the two inclined surfaces of the first substrate.

4. The light-emitting element according to claim 1, wherein the material of the first substrate comprises sapphire, Si, SiC, GaN, ZnO, GaP or ceramic, and the material of the second substrate comprises polyimide, BCB, PFCB, epoxy, acrylic resin, COC, PMMA, PET, PC, polyetherimide, fluorocarbon polymer, silicone resin, glass, $Al_2O_3$, $SiO_2$, $TiO_2$, $SiN_x$, or SOG.

5. The light-emitting element according to claim 1, wherein the first conductive-attaching layer comprises a first metal-attaching layer formed on the first surface of the first substrate, and the second conductive-attaching layer comprises a second metal-attaching layer formed on the bottom of the transparent conductive layer.

6. The light-emitting element according to claim 5, wherein the material of the first substrate comprises Si, GaN, ZnO or GaP, and the material of the second substrate comprises polyimide, BCB, PFCB, epoxy, acrylic resin, COC, PMMA, PET, PC, polyetherimide, fluorocarbon polymer, silicone resin, glass, $Al_2O_3$, $SiO_2$, $TiO_2$, $SiN_x$, or SOG.

7. The light-emitting element according to claim 5, wherein a reflective index of the second conductive-attaching layer is higher than that of the first conductive-attaching layer.

8. The light-emitting element according to claim 1, wherein the first conductive-attaching layer comprises a first transparent-conductive bonding layer formed on the substrate structure, and the second conductive-attaching layer comprises a second transparent-conductive bonding layer formed on one side of the light-emitting stack.

9. A manufacturing method of a light-emitting element comprising steps of:

providing a first substrate, and forming a recess structure on a surface thereof for defining a plurality of protrusions, wherein each side wall of the protrusions is not perpendicular to a bottom surface of the first substrate;

forming a reflective layer conforming to the surface of the first substrate;

providing a second substrate being transparent and formed in the recess structure of the first substrate, thereby forming a substrate structure;

providing a light-emitting stack; and providing an adhesive layer attaching the light-emitting stack to the substrate structure.

10. The method of claim 9, wherein the first substrate comprises a silicon substrate, the recess structure is formed by etching, and each side wall of the protrusions comprises an inclined angle with respect to the bottom surface of the first substrate, and the inclined angle is formed along an exposed silicon crystal lattice, the exposed silicon crystal lattice resulting from the etching of the silicon substrate.

11. The method of claim 9, wherein the process for forming the second substrate further comprises:

filling a transparent liquid material in the recess structure;

solidifying the transparent liquid material; and performing a polishing process for removing the excess of the second substrate.

12. The method of claim 11, wherein the adhesive layer comprises an insulating-adhesive layer.

13. The method of claim 12, wherein the insulating-adhesive layer comprises silicone resin, BCB, epoxy, polyimide, or PFCB.

14. The method of claim 9, wherein the process for providing the adhesive layer to attach the light-emitting stack to the substrate structure further comprises:

forming a first metal-attaching layer on each top surface of the protrusions of the first substrate; forming a plurality of second metal-attaching layers on a bottom of the light-emitting stack, and performing an alloying process between the first metal-attaching layer and the second metal-attaching layer, and attaching the second substrate to the bottom of the light-emitting stack at the same time.

15. The method of claim 9, wherein the process for providing the adhesive layer to attach the light-emitting stack to the substrate structure comprises:

forming a first transparent-conductive bonding layer on the substrate structure;

forming a second transparent-conductive bonding layer on a bottom of the light-emitting stack; and attaching the first transparent-conductive bonding layer to the second transparent-conductive bonding layer.

* * * * *